(12) United States Patent
Park et al.

(10) Patent No.: US 6,483,145 B1
(45) Date of Patent: Nov. 19, 2002

(54) ELECTRICALLY ERASABLE PROGRAMMABLE READ-ONLY MEMORY (EEPROM) DEVICES INCLUDING MULTILAYER SENSE AND SELECT TRANSISTOR GATES

(75) Inventors: Weon-Ho Park, Kyungki-do (KR);
Min-Soo Cho, Kyungki-do (KR);
Jeung-Wook Han, Kyungki-do (KR);
Chil-Hee Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/426,734

(22) Filed: Oct. 26, 1999

(30) Foreign Application Priority Data

Dec. 23, 1998 (KR) .............................. 98-57517

(51) Int. Cl.[7] .......................................... H01L 29/788
(52) U.S. Cl. ...................................... 257/316; 438/258
(58) Field of Search ........................ 257/316, 315–323; 438/257–267

(56) References Cited

U.S. PATENT DOCUMENTS

| | | | |
|---|---|---|---|
| 4,477,825 A | 10/1984 | Yaron et al. ................ | 357/23.5 |
| 5,981,340 A | * 11/1999 | Chang et al. ................ | 438/258 |
| 5,981,342 A | * 11/1999 | Kakoschke et al. ......... | 438/266 |

OTHER PUBLICATIONS

Betty Prince, *Semiconductor Memories: A Handbook of Design, Manufacture and Application*, Second Edition, Chapter 12, 1991, pp. 609–650.

* cited by examiner

Primary Examiner—Richard Booth
(74) Attorney, Agent, or Firm—Myers Bigel Sibley & Sajovec

(57) ABSTRACT

EEPROM devices include a gate insulating layer and a tunnel insulating layer that is thinner than the gate insulating layer, on an integrated circuit substrate, and a sense transistor gate on the tunnel insulating layer and on the gate insulating layer. The sense transistor gate includes a floating gate on the tunnel insulating layer and on the gate insulating layer, a first interlevel insulating layer on the floating gate opposite the tunnel insulating layer and the gate insulating layer, and a sense gate on the first interlevel insulating layer opposite the floating gate. A select transistor gate also is included on the gate insulating layer and spaced apart from the sense transistor gate. The select transistor gate includes a first select gate on the gate insulating layer that is spaced apart from the sense transistor gate, a second interlevel insulating layer on the first select gate opposite the gate insulating layer, and a second select gate on the second interlevel insulating layer opposite the first select gate that is spaced apart from the sense gate. A first doped region is beneath the tunnel insulating layer and extends to beneath the select transistor gate. A second doped region is beneath the sense transistor gate and is spaced apart from the first doped region. A third doped region is beneath the select transistor gate and is spaced apart from the first doped region. EEPROM devices may be fabricated by forming a gate insulating layer and a tunnel insulating layer that is thinner than the gate insulating layer on an integrated circuit substrate, and a first doped region in the integrated circuit substrate beneath the tunnel insulating layer and beneath a portion of the gate insulating layer. A first conductive layer, an interlevel insulating layer and a second conductive layer are sequentially formed on the tunnel insulating layer and on the gate insulating layer. The second conductive layer, the interlevel insulating layer and the first conductive layer then are patterned, to define a sense transistor gate on the tunnel insulating layer and on the gate insulating layer that comprises a first portion of the first conductive layer, a first portion of the interlevel insulating layer and a first portion of the second conductive layer, and to further define a select transistor gate on the gate insulating layer and spaced apart from the sense transistor gate, that comprises a second portion of the first conductive layer, a second portion of the interlevel insulating layer, and a second portion of the second conductive layer.

8 Claims, 7 Drawing Sheets

ELECTRICALLY ERASABLE PROGRAMMABLE READ-ONLY MEMORY (EEPROM) DEVICES INCLUDING MULTILAYER SENSE AND SELECT TRANSISTOR GATES

FIELD OF THE INVENTION

This invention relates to integrated circuit memory devices and fabrication methods therefor, and more particularly to EEPROM memory devices and methods of fabricating the same.

BACKGROUND OF THE INVENTION

EEPROMs are nonvolatile memory devices that are electrically programmable. For electrical reprogrammability, an EEPROM can use a mechanism known as Fowler-Nordheim tunneling, also referred to as electron tunneling, or simply tunneling. Fowler-Nordheim tunneling is a quantum mechanical effect which allows electrons to pass through an energy barrier at a silicon-silicon dioxide interface at a lower energy than the 3.2 eV that is generally required to pass over this energy barrier.

Flash-type EEPROMs may include a one-transistor storage cell. Other types of EEPROMs may include a two-transistor storage cell. The basic two-transistor storage cell includes an access or select transistor and a double polysilicon storage or sense transistor. The sense transistor includes a floating polysilicon gate that is isolated in silicon dioxide, and that is capacitively coupled to a second polysilicon control gate that is stacked above it. The floating gate tunneling oxide cell is often referred to as a FLoating gate Tunnel OXide or FLOTOX-type of EEPROM. An overview of EEPROMs is provided in Chapter 12 of the textbook entitled *Semiconductor Memories*, pp. 609–650, the disclosure of which is hereby incorporated herein by reference.

Figure 1:
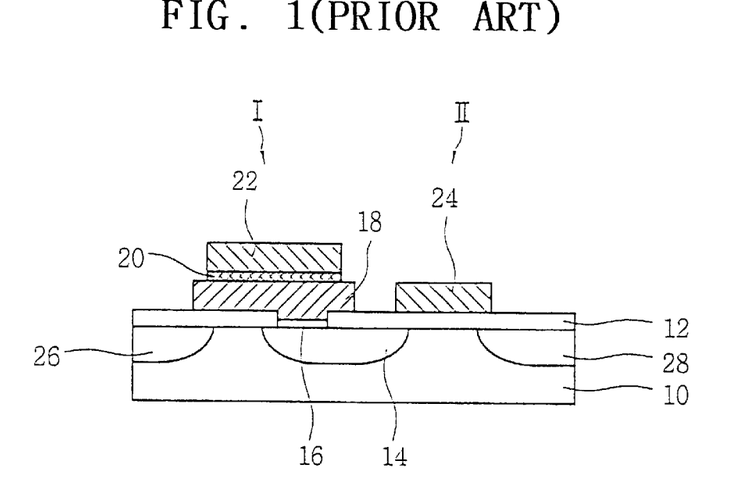
FIGS. 1 and 2 are cross-sectional views of conventional EEPROM devices.

FIG. 1 is a cross-sectional view of a first conventional FLOTOX-type EEPROM memory cell. As shown in FIG. 1, a thin tunnel insulating layer 16 and a thick gate insulating layer 12 are formed on an integrated circuit substrate 10, such as a monocrystalline silicon substrate. A sense transistor gate I is a multilayered structure including a floating gate 18, an interlevel insulating layer 20 and a sense gate 22 on the tunnel insulating layer 16 and on a portion of the gate insulating layer 12. A select transistor gate II includes a single select gate layer 24 on the gate insulating layer 12 and spaced apart from the sense transistor gate I.

Continuing with the description of FIG. 1, a doped region 14 extends from beneath the tunnel insulating layer 16 to beneath the select transistor gate II. A second doped region, also referred to as a source region 26, is spaced apart from the first doped region 14 and extends from beneath the sense gate I to outside the sense gate. Finally, a third doped region 28 is spaced apart from the first and second doped regions 14 and 26, and extends from beneath the select gate II to outside the select gate II. Each of the first, second and third doped regions 14, 26 and 28 preferably forms a semiconductor junction with the substrate 10.

The floating gate 18 may be fabricated from a first polysilicon layer and the sense gate 22 and the select gate layer 24 may be fabricated from a second polysilicon layer. As also shown in FIG. 1, the sense gate 22 may be narrower than the floating gate 18. EEPROM cells according to FIG. 1 may be fabricated by patterning a first polysilicon layer to fabricate the floating gate 18. Then, the sense gate 22 and the single select gate layer 24 may be patterned from a second polysilicon layer in a second photolithography process. Unfortunately, in such a process, it may be difficult to align the sense gate 22 to the floating gate 18 when the size of the memory cell is decreased. Moreover, short circuits may be produced by residual polysilicon material that is generated when etching the second polysilicon layer, which can reduce process reliability.

Figure 2:
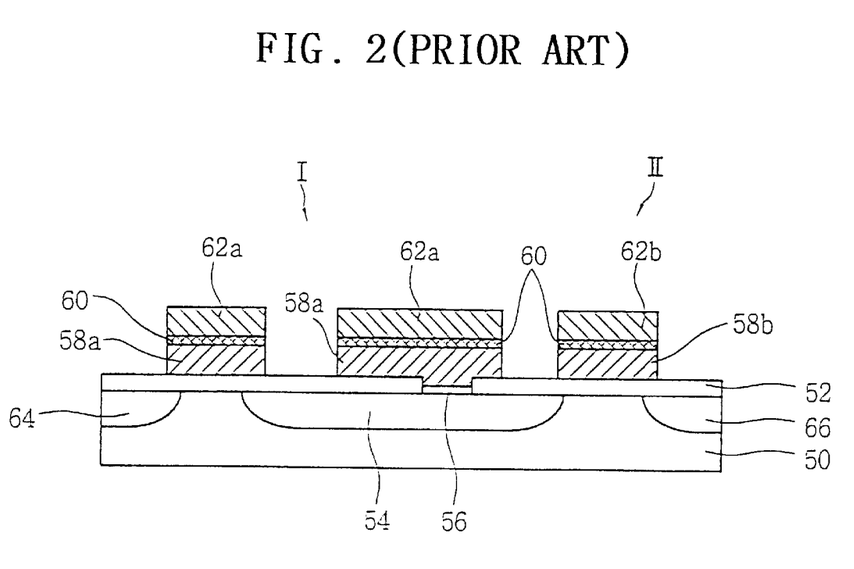

FIG. 2 is a cross-sectional view of another conventional EEPROM storage cell. In the device of FIG. 2, the floating gate 58a and the sense gates 62a that form the sense transistor gate I are separated into two spaced apart portions. Moreover, the select transistor gate II may be formed from two layers of polysilicon 58b and 62b that are separated by an interlevel insulating layer 60, and that may be electrically interconnected, for example using a suitable buried contact or other means well known to those having skill in the art. The sense transistor gate I and the select transistor gate II may be formed in a one step etching process by etching a second polysilicon layer 62, an interlevel insulating layer 60 and a first polysilicon layer 58 in sequence. A first doped region 54 is formed beneath the tunnel insulating layer 56 and beneath the gate insulating layer 52 in the integrated circuit substrate 50. Second and third (source and drain) doped regions 64 and 66 also may be formed. See U.S. Pat. No. 4,477,825 to Yaron et al.

In the EEPROM cell of FIG. 2, alignment of the sense gate 62a to the floating gate 58a may be improved, since a single photolithography step may be used. However, since the floating gates 58a and the sense gates 62a are separated, the unit cell size may be larger than the device of FIG. 1. Accordingly, it may be difficult to form highly integrated EEPROM devices using the unit cell of FIG. 2.

SUMMARY OF THE INVENTION

It is therefore an object of the present invention to provide improved EEPROM devices and methods of fabricating the same.

It is another object of the present invention to provide EEPROM devices and fabrication methods that can provide improved alignment between the floating gate and the sense gate thereof.

It is still another object of the present invention to provide EEPROM devices and fabrication methods that can be highly integrated with high reliability.

These and other objects can be provided, according to the present invention, by EEPROM devices that include a gate insulating layer and a tunnel insulating layer that is thinner than the gate insulating layer, on an integrated circuit substrate, and a sense transistor gate on the tunnel insulating layer and on the gate insulating layer. The sense transistor gate comprises a floating gate on the tunnel insulating layer and on the gate insulating layer, a first interlevel insulating layer on the floating gate opposite the tunnel insulating layer and the gate insulating layer, and a sense gate on the first interlevel insulating layer opposite the floating gate. A select transistor gate also is included on the gate insulating layer and spaced apart from the sense transistor gate. The select transistor gate comprises a first select gate on the gate insulating layer that is spaced apart from the sense transistor gate, a second interlevel insulating layer on the first select gate opposite the gate insulating layer, and a second select gate on the second interlevel insulating layer opposite the first select gate that is spaced apart from the sense gate.

EEPROM devices according to the present invention also include first, second and third doped regions in the integrated circuit substrate. The first doped region is beneath the tunnel insulating layer and extends to beneath the select transistor gate. The second doped region is beneath the sense transistor gate and is spaced apart from the first doped region. The third doped region is beneath the select transistor gate and is spaced apart from the first doped region.

The floating gate and the first select gate preferably comprise respective first and second portions of a first layer, and the sense gate and the second select gate preferably comprise respective first and second portions of a second layer. The first and second layers preferably comprise polysilicon and may comprise polycide. The first and second interlevel insulating layer also preferably are first and second portions of a third layer that preferably comprises oxide such as silicon dioxide and/or silicon oxynitride.

The first, second and third doped regions also may include lightly doped and heavily doped portions. In particular, the first doped region may comprise a first portion that extends from beneath the tunnel insulating layer to outside the sense transistor gate, and a second portion that extends from the first portion to beneath the select transistor gate. The second doped region may comprise a first portion that is outside the sense transistor gate and a second portion that extends from the first portion to beneath the sense transistor gate. The third doped region may comprise a first portion that is outside the select transistor gate, and a second portion that extends from the first portion to beneath the select transistor gate. In each of these regions, the second portion preferably is lightly doped relative to the first portion. Accordingly, since only one floating gate is used in the unit cell, highly integrated unit cells may be provided.

EEPROM devices may be fabricated, according to the present invention, by forming a gate insulating layer and a tunnel insulating layer that is thinner than the gate insulating layer on an integrated circuit substrate, and a first doped region in the integrated circuit substrate beneath the tunnel insulating layer and beneath a portion of the gate insulating layer. A first conductive layer, an interlevel insulating layer and a second conductive layer are sequentially formed on the tunnel insulating layer and on the gate insulating layer. The second conductive layer, the interlevel insulating layer and the first conductive layer then are patterned, to define a sense transistor gate on the tunnel insulating layer and on the gate insulating layer that comprises a first portion of the first conductive layer, a first portion of the interlevel insulating layer and a first portion of the second conductive layer, and to further define a select transistor gate on the gate insulating layer and spaced apart from the sense transistor gate, that comprises a second portion of the first conductive layer, a second portion of the interlevel insulating layer, and a second portion of the second conductive layer.

Then, second, third and fourth doped regions are simultaneously formed in the integrated circuit substrate using the sense transistor gate and the select transistor gate as a mask. The second, third and fourth doped regions are spaced apart from each other. The second doped region extends from beneath the sense transistor gate to outside the sense transistor gate. The third doped region extends from beneath the select transistor gate to outside the select transistor gate. The doped region extends from the first doped region to beneath the select transistor gate.

Thereafter, a fifth doped region may be formed within the second doped region outside the sense transistor gate and a sixth doped region may be formed within the third doped region outside the select transistor gate. The fifth and sixth doped regions may be formed simultaneously. The first, fifth and sixth doped regions preferably are heavily doped relative to the respective fourth, second and third doped regions.

The gate insulating layer, tunnel insulating layer and first doped region preferably are formed by forming the gate insulating layer on the integrated circuit substrate and implanting dopants into a first portion of the integrated circuit substrate through the gate insulating layer to form the first doped region. The gate insulating layer then is removed from a portion of the first doped region, to expose the portion of the first doped region. The tunnel insulating layer then is formed on the exposed portion of the first doped region.

The integrated circuit substrate also may include field isolation regions therein. In this case, the first conductive layer may be blanket formed on the integrated circuit substrate including on the field isolation regions, and then patterned to remove a portion thereof from the field isolation regions. The interlevel insulating layer and the second conductive layer then may be blanket formed. Since the sense transistor gate and select transistor gate may be simultaneously defined, alignment between the floating gate and the sense gate may be improved. Accordingly, highly integrated and/or highly reliable EEPROMs may be fabricated.

BRIEF DESCRIPTION OF THE DRAWINGS

FIGS. 5A–12A are cross-sectional views of integrated circuit devices according to the present invention taken along the line 4A–4A' in FIG. 3, during intermediate fabrication steps.

FIGS. 5B–12B are cross-sectional views of integrated circuit devices according to the present invention taken along the line 4B–4B' in FIG. 3, during intermediate fabrication steps.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

According to the invention, an EEPROM unit cell can include only one sense transistor gate and only one select transistor gate. The sense transistor gate includes a floating gate, an interlevel insulating layer and a sense gate. The select transistor gate includes a first select gate, an interlevel insulating layer and a second select gate. The gates may be formed using one photolithography process. Accordingly, the unit cell size of EEPROMs may be reduced and/or the reliability of the fabrication process may be enhanced.

Figure 3:
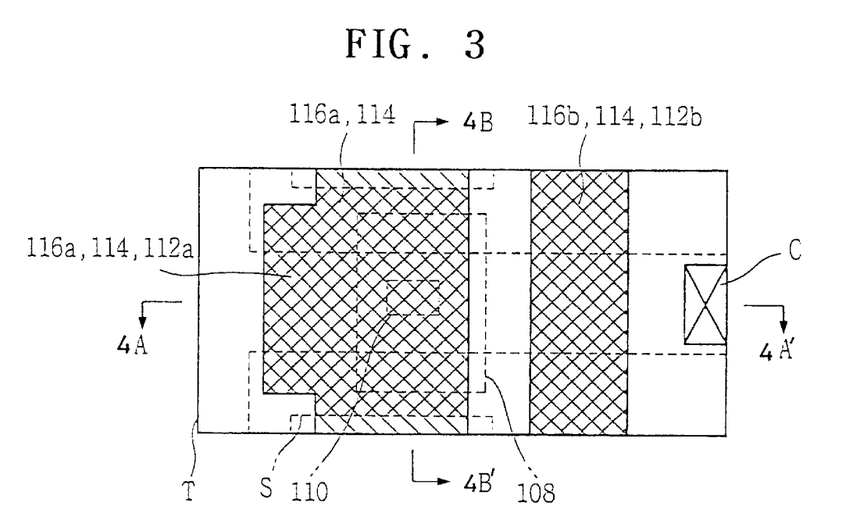
FIG. 3 is a plan view of EEPROM devices according to the present invention.
Figure 4A:
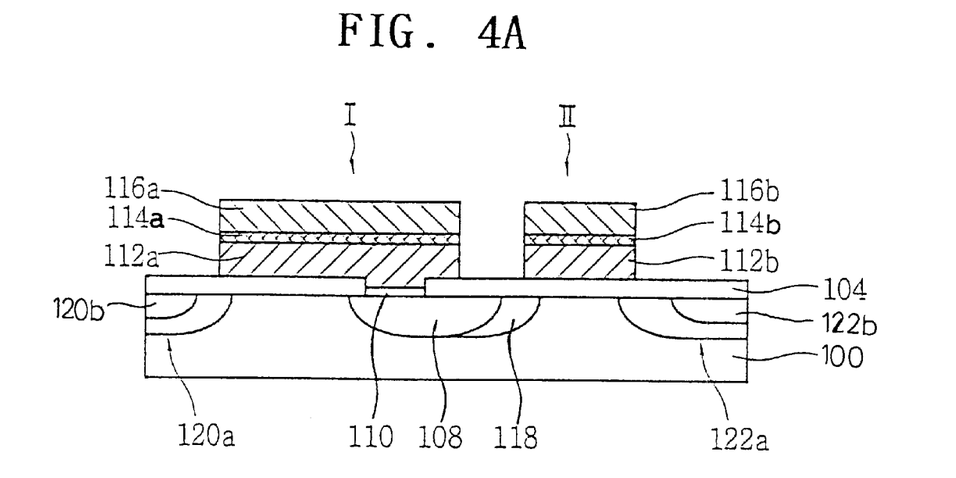
FIGS. 4A and 4B are cross-sectional views of EEPROM devices of FIG. 3, taken along lines 4A–4A' and 4B–4B' of FIG. 3.
Figure 4B:
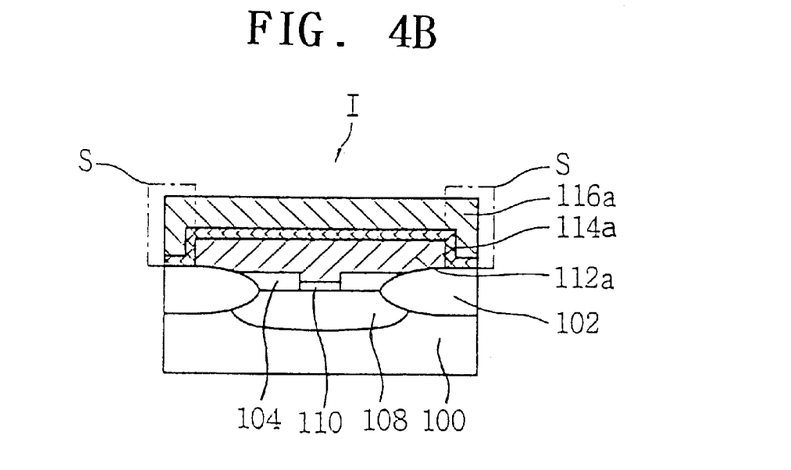

Referring now of FIGS. 3, 4A and 4B, an integrated circuit substrate 100, such as a monocrystalline silicon substrate, may include a field isolation layer such as a field oxide layer 102 that defines active regions of the integrated circuit substrate. A thin tunnel insulating layer 110, for example having thickness of between about 50 Å and about 90 Å, and a thick gate insulating layer 104, for example having a thickness of between about 300 Å and about 500 Å, are included on the active portions of the integrated circuit substrate 100 between the field insulation regions 102. A sense transistor gate I is provided on the tunnel insulating layer 110 and on the gate insulating layer 104. The sense transistor gate comprises a floating gate 112a on the tunnel insulating layer 110 and on the gate insulating layer 104, a first interlevel insulating layer 114a on the floating gate 112a and a sense gate 116a on the first interlevel insulating layer 114a opposite the floating gate 112a. The select transistor gate II is provided on the gate insulating layer 104 and spaced apart from the sense transistor gate I. The select transistor gate comprises a first select gate 112b, on the gate insulating layer 104 that is spaced apart from the sense transistor gate 112a, a second interlevel insulating layer 114b on the first select gate 112b opposite the gate insulating layer 104, and a second select gate 116b on the second interlevel insulating layer 114b opposite the first select gate 112b, that is spaced apart from the sense gate 116a. The first and second select gates 112b and 116b may be electrically connected by a buried contact or other conventional means.

A first doped region comprising a first portion 108 and a second portion 118 is included in the integrated circuit substrate 100 beneath the tunnel insulating layer 110 and extending to beneath the select transistor gate II. More particularly, the first portion 108 of the first doped region extends from beneath the tunnel insulating layer 110 to outside the sense transistor gate I and the second portion 118 extends from the first portion 108 to beneath the select transistor gate II.

A second doped region, also referred to as a source region, also is included in the integrated circuit substrate beneath the sense transistor gate I and spaced apart from the first doped region 108/118. As shown in FIG. 4A, the second doped region preferably comprises a first portion 120b that is outside the sense transistor gate I and a second portion 120a that extends from the first portion 120b to beneath the sense transistor gate I.

A third doped region, also referred to as a drain region, also is provided in the integrated circuit substrate beneath the select transistor gate II and spaced apart from the first doped region 108/118. The third doped region preferably comprises a first portion 122b that is outside the select transistor gate II and a second portion 122a that extends from the first portion 122b to beneath the select transistor gate II. In the first, second and third doped regions, the second portions thereof preferably are lightly doped relative to the first portions thereof. The first, second and third doped regions also preferably form junctions with the integrated circuit substrate 100.

As will be described below, the floating gate 112a and the first select gate 112b preferably comprise respective first and second portions of a first layer, and the sense gate 116a and the second select gate 116b preferably comprise first and second portions of the second layer. The first and second layers preferably comprise polysilicon and may include polycide, such as polysilicon and tungsten silicide. The first and second interlevel insulating layers 114a and 114b also preferably are first and second portions of a third layer. The third layer preferably comprises oxide and can include silicon oxynitride.

Finally, referring to FIG. 3, reference T designates the active region on the substrate 100. Reference S designates the portion where only the interlevel insulating layer 114 and the sense gate 116a are formed on the field insulating layer 102 without the floating gate 112. Reference C denotes the bit line contact.

Operations for storing (writing), erasing and reading data in EEPROMs of FIGS. 3 and 4A–4B will be described briefly. In particular, for erasing, a high voltage such as vabout 15–18V is applied to the sense gate 116a. When the bit line connected to the drain region 122a/122b is grounded, a high voltage such as about 15–18V is applied to the second select transistor gate 116b, which turns on the select transistor, to thereby supply a strong electric field between the first sense gate 116a of the sense transistor and the bit line. Some of the electrons supplied from the bit line are injected into the floating gate 112a and tunnel through the tunnel insulating layer 112, and thereby provide an erasing operation. Thus, if the floating gate 112a is filled with electrons, the threshold voltage of the memory cell increases. Moreover, a channel is not generated because of the high threshold voltage, so that the off-state is memorized.

In order to store new data, the sense gate 116a is grounded and a high voltage such as about 15–18V is applied to the bit line connected to the drain region 122a/122b, and a high voltage such as about 15–18V is applied to the second select gate 116b which selectively turns on the select transistor. Thus, if a strong electric field is applied to both ends of the tunnel insulating layer 110 beneath the floating gate 112a and the substrate 100, electrons stored in the floating gate 112a penetrate the thin barrier and are discharged toward the drain region 122a/122b in the substrate 100 through the first doped region 108/118. As a result, data programming is performed. Thereafter, if the cell is read by applying power to the second select gate 116b that serves as a word line, current flows through a channel that results from the low threshold. Accordingly, the state can be memorized. Thus, data is read by determining if current is present in the memory cell transistor by applying an appropriate voltage to the bit line and sense gate 116a of the selected cell. Table 1 summarizes the operational conditions for EEPROM cells according to the present invention.

TABLE 1

|  | Bit line | Second select gate | Sense gate | Source region | Bulk |
|---|---|---|---|---|---|
| Program | Vpp | Vpp | GND | floating | GND |
| Erase | GND | Vpp | Vpp | GND | GND |
| Read | 1–3V | 1–5V | 0.5–2V | GND | GND |

In the Table, Vpp represents a high voltage, such as about 15–18V, and GND represents ground potential.

Methods of fabricating EEPROM devices according to the invention now will be described. FIGS. 5A–12A and 5B–12B illustrate EEPROM devices according to the present invention during intermediate fabrication steps.

Figure 5A:
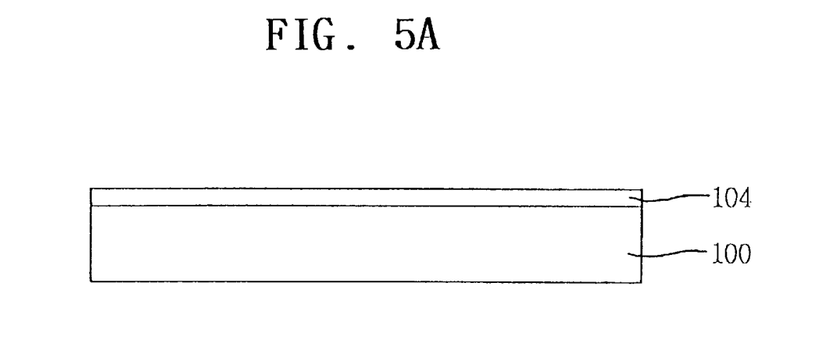
Figure 5B:
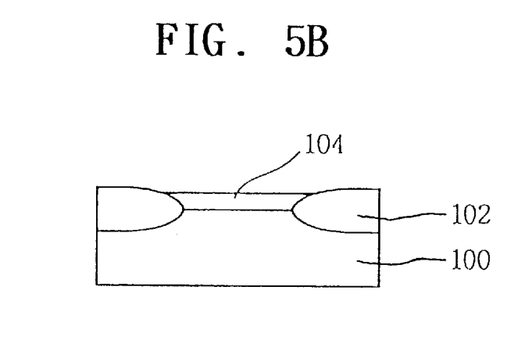

Referring now to FIGS. 5A and 5B, a field oxide region 102 is formed in an integrated circuit substrate 100, to define an active region and an inactive region. Conventional field isolation, such as thermal oxidation and/or trench isolation may be used. A gate insulating layer 104 is formed on the active region of the substrate 100 between the field isolation regions 102. The gate insulating layer may have a thickness of between 300 Å and about 500 Å.

Figure 6A:
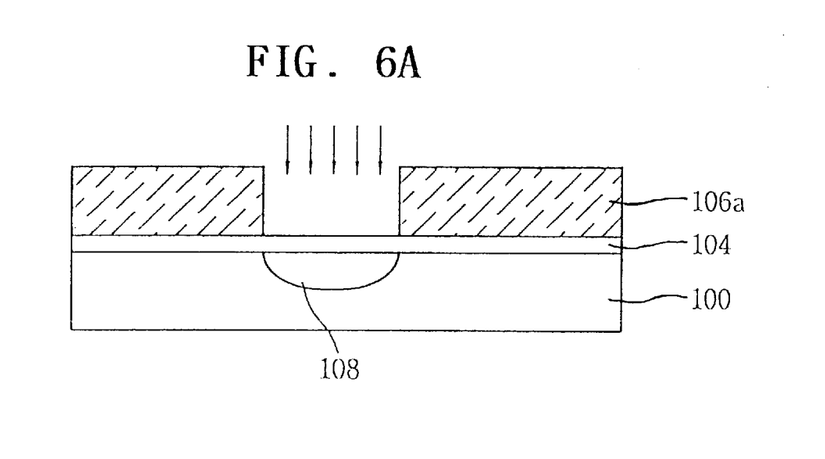
Figure 6B:
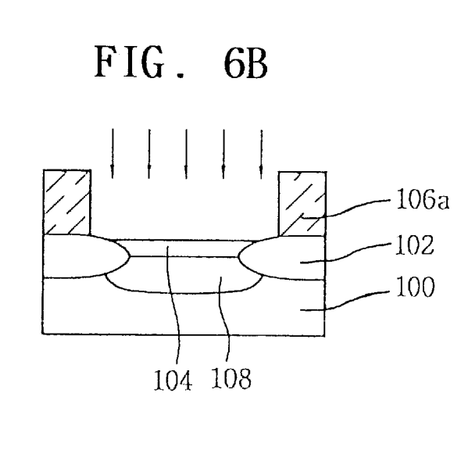

Then, referring to FIGS. 6A and 6B, a first photoresist pattern 106a is formed and dopants are implanted into a first portion of the integrated circuit substrate through the gate insulating layer 104 to form the first doped region 108. It will be understood that a heavily doped implant of ions of conductivity opposite the substrate, for example n+-type ions, preferably are implanted into the exposed part of the gate insulating layer 104.

Figure 7A:
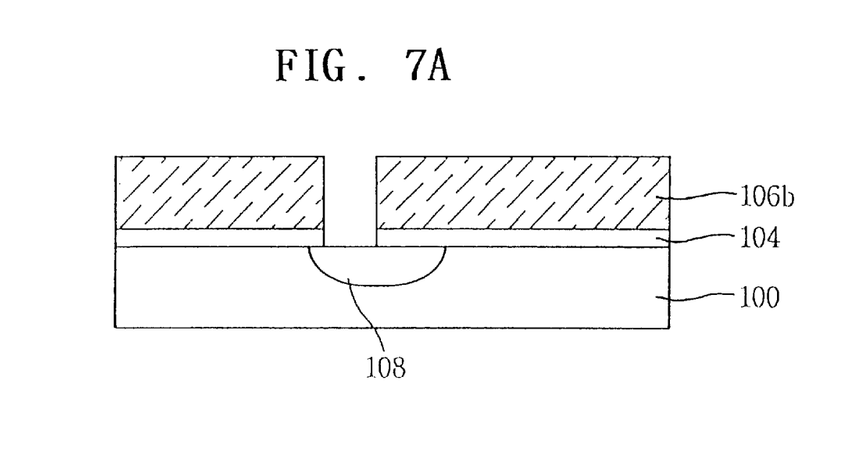
Figure 7B:
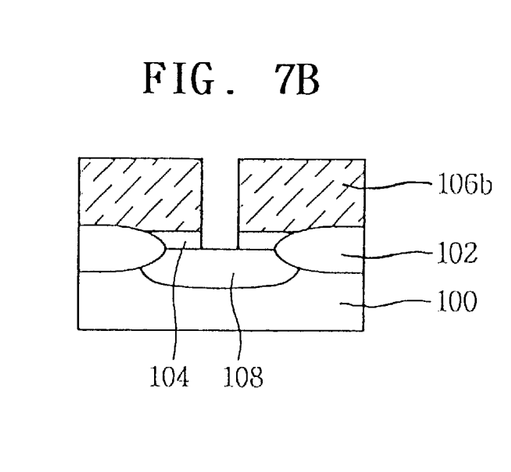

Referring now to FIGS. 7A and 7B, the first photoresist pattern 106a is removed and a second photoresist pattern 106b is formed, to expose a portion of the first doped region 108. The gate insulating layer 104 is removed from on the portion of the first doped region 108, to thereby expose the portion of the first doped region. Wet etching may be used.

Figure 8A:
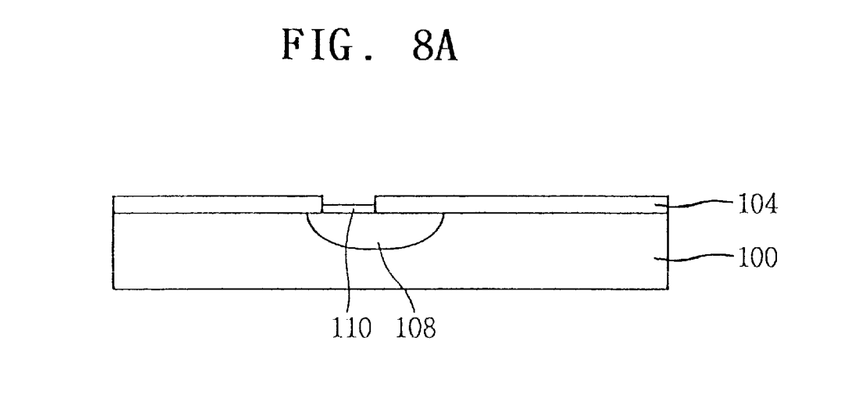
Figure 8B:
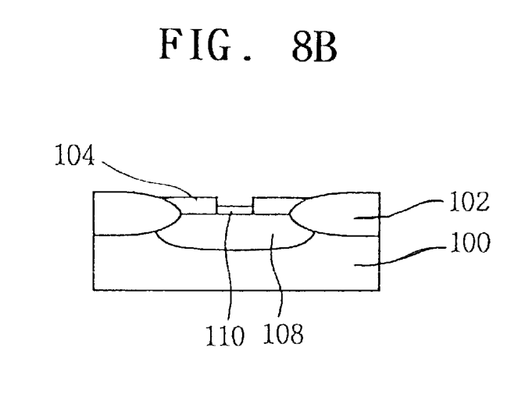

Then, referring to FIGS. 8A and 8B, the second photoresist pattern 106b is removed and the tunnel insulating layer 110 is formed on the exposed portion of the first doped region 108. The tunnel insulating layer 110 may have thickness of between about 50Å and about 90Å.

Figure 9A:
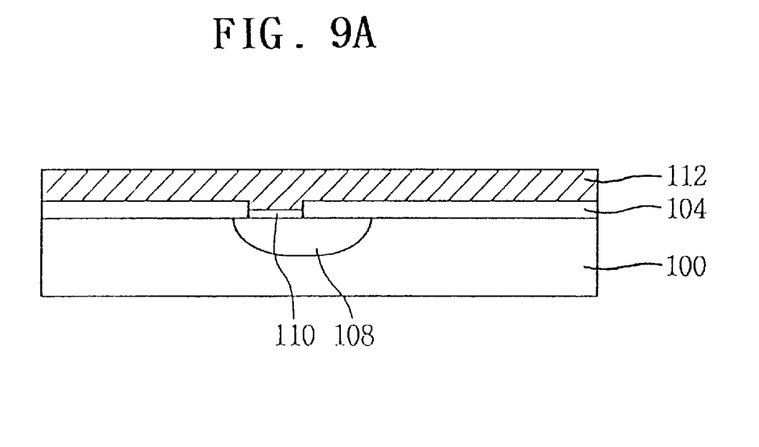
Figure 9B:
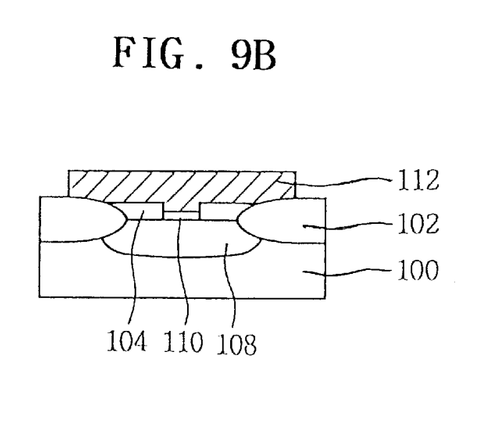

Referring now to FIGS. 9A and 9B, a first conductive layer 112 preferably comprising polysilicon is blanket formed on the integrated circuit substrate. In order to separate the floating gates between unit cells, the first conductive layer 112 preferably is patterned to remove a portion thereof from the field isolation regions. This portion is denoted by S in FIGS. 3 and 4B.

Figure 10A:
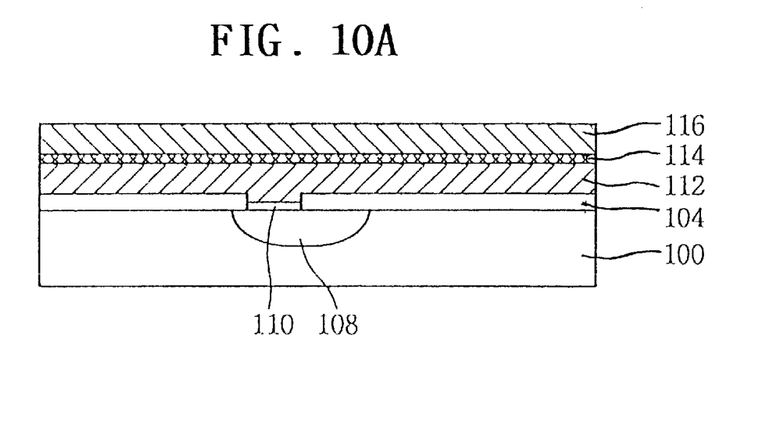
Figure 10B:
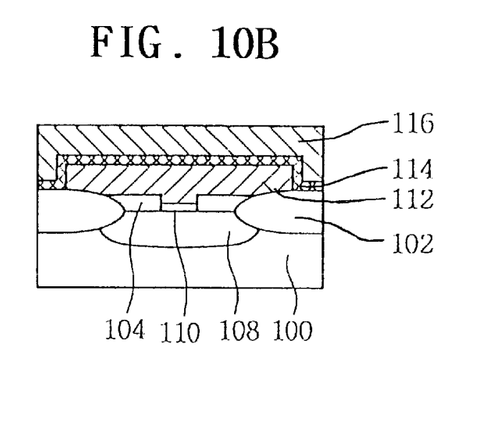

Referring now to FIGS. 10A and 10B, an interlevel insulating layer 114 and a second conductive layer 116 preferably comprising polysilicon are formed on the first conductive layer 112, including on the field oxide layer. It will be understood that the interlevel insulating layer 114 may include a single layer, preferably comprising silicon dioxide or a multilayer structure, for example an oxide/nitride/oxide structure. Other structures also may be used. It also will be understood that the second conductive layer 116 and/or the first conductive layer 112 may include a polycide structure.

Figure 11A:
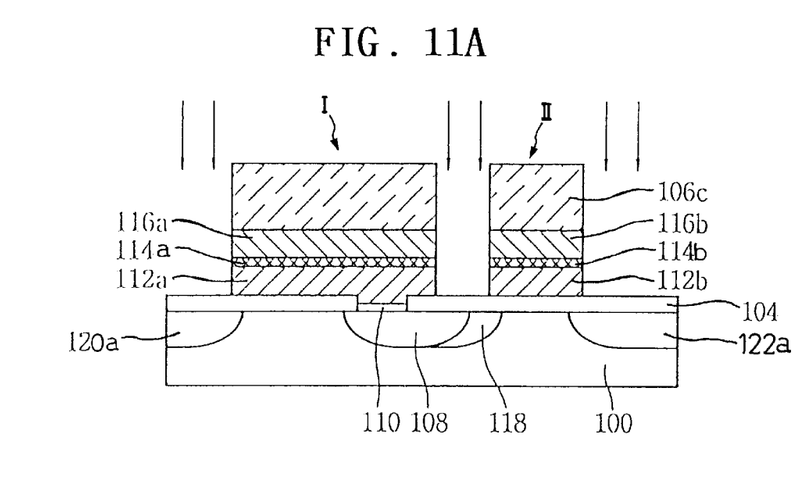
Figure 11B:
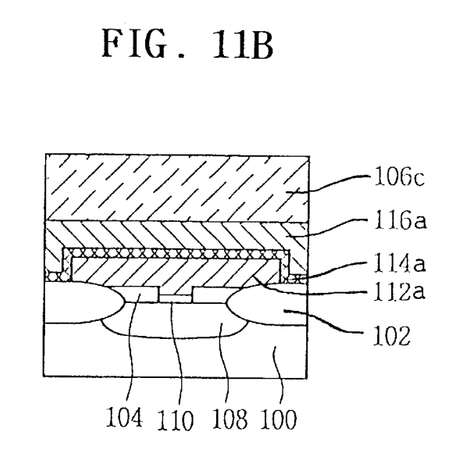

Referring now to FIGS. 11A and 11B, a third photoresist pattern 106c is formed on the second conductive layer. The second conductive layer 116, the interlevel insulating layer 114 and the first conductive layer 112 are then patterned, to thereby define the sense transistor gate I and the select transistor gate II. Preferably, the second conductive layer 116, the interlevel insulating layer 114 and the first conductive layer 112 are successively etched using the photoresist pattern 106c as a mask. As a result, the sense transistor gate I including the floating gate 112a, the first interlevel insulating layer 114a and the sense gate 116 is formed on the tunnel insulating layer 110 and on the gate insulating layer 104, and the select transistor gate II including the first select gate 112b, the second interlevel insulating layer 114b and the second select gate 116b is formed on the gate insulating layer 104 and spaced apart from the sense transistor gate I.

Still referring to FIGS. 11A and 11B, ions, such as n-type ions of opposite conductivity type to the substrate, are implanted, to thereby form second, third and fourth doped regions 120a, 122a and 118. The second and third doped regions 120a and 122a form parts of the source region and drain region respectively.

Figure 12A:
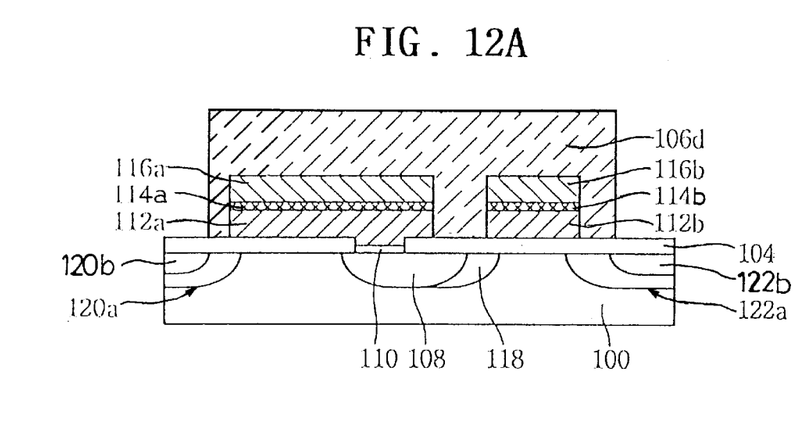
Figure 12B:
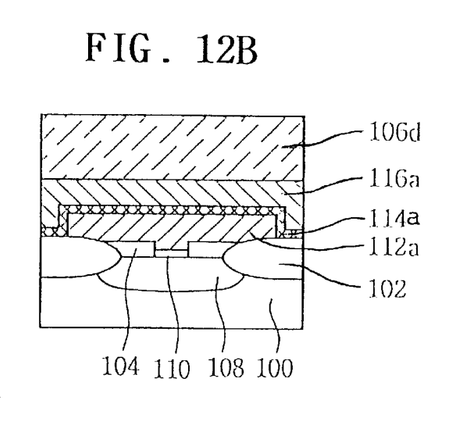

Finally, referring to FIGS. 12A and 12B, the third photoresist pattern 106 is removed and a fourth photoresist pattern 106d is formed. Using the fourth photoresist pattern as a mask, heavily doped impurity ions, for example n+-type of opposite conductivity type to the substrate are implanted to form fifth doped region 120b and sixth doped region 122b within the second and third doped regions 120a and 122a respectively. Accordingly, the source and drain regions may include lightly doped and heavily doped portions. The fourth photoresist pattern 106d then may be removed.

It also will be understood that the process sequence described above may be varied. For example, the heavily doped source and drain regions 120b and 122b may be formed in separate steps in FIGS. 12A and 12B, by removing the third photoresist pattern 106c, forming the heavily doped source region 120a by implanting heavily doped ions into the substrate, forming an insulating layer, selectively etching the insulating layer to define a bit line and implanting heavily doped ions to form the heavily doped drain region 122b. Many other variations in the structures and processes described above may be provided.

Accordingly, the sense transistor gate I and the select transistor gate II both may have multilayered structures, and may be formed at the same time in a single etch step, using the third photoresist pattern 106c as a mask. Accordingly, alignment between the floating gate 112a and the sense gate 116a may be improved. Moreover, since only one floating gate 112a and one sense gate 116a is formed, the unit cell size of the EEPROM may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An electrically erasable programmable read only memory (EEPROM) comprising:

an integrated circuit substrate;

a gate insulating layer and a tunnel insulating layer that is thinner than the gate insulating layer, on the integrated circuit substrate;

a sense transistor gate on the tunnel insulating layer and on the gate insulating layer, the sense transistor gate comprising a floating gate on the tunnel insulating layer and on the gate insulating layer, a first interlevel insulating layer on the floating gate opposite the tunnel insulating layer and the gate insulating layer, and a sense gate on the first interlevel insulating layer opposite the floating gate;

a select transistor gate on the gate insulating layer and spaced apart from the sense transistor gate, the select transistor gate comprising a first select gate on the gate insulating layer that is spaced apart from the sense transistor gate, a second interlevel insulating layer on the first select gate opposite the gate insulating layer, and a second select gate on the second interlevel insulating layer opposite the first select gate that is spaced apart from the sense gate;

a first doped region in the integrated circuit substrate beneath the tunnel insulating layer and extending in the integrated substrate to beneath the select transistor gate, the first doped region having:

a first portion that extends from beneath the tunnel insulating layer to outside the sense transistor gate and extends to a first depth in the integrated circuit substrate; and a second portion that extends from the first portion to beneath the select transistor gate, extends to the first depth and is lightly doped relative to the first portion;

a second doped region in the integrated circuit substrate beneath the sense transistor gate and spaced apart from the first doped region, the second doped region having:
  a third portion outside the sense transistor gate and extending to a second depth in the integrated circuit substrate; and
  a fourth portion extending from the third portion to beneath the sense transistor gate, extending to a third depth in the integrated circuit substrate, deeper than the second depth, and being lightly doped relative to the third portion; and
a third doped region in the integrated circuit substrate beneath the select transistor gate and spaced apart from the first doped region, the third doped region having:
  a fifth portion outside the sense transistor gate and extending to a fourth depth in the integrated circuit substrate; and
  a sixth portion extending from the sixth portion to beneath the select transistor gate, extending to a fifth depth in the integrated circuit substrate, deeper than the fourth depth, and being lightly doped relative to the fifth portion.

2. An EEPROM according to claim 1 wherein the floating gate and the first select gate comprise respective first and second portions of a first layer and wherein the sense gate and the second select gate comprise respective first and second portions of a second layer.

3. An EEPROM according to claim 2 wherein the first and second layers are first and second layers that comprise polysilicon.

4. An EEPROM according to claim 2 wherein the first and second interlevel insulating layers are first and second portions of a third layer.

5. An EEPROM according to claim 4 wherein the third layer comprises oxide.

6. An EEPROM according to claim 1, wherein the first, third and fifth depths are equal and wherein the second and fourth depths are equal.

7. An electrically erasable programmable read only memory (EEPROM) comprising:
  an integrated circuit substrate;
  a gate insulating layer and a tunnel insulating layer that is thinner than the gate insulating layer, on the integrated circuit substrate;
  a sense transistor gate on the tunnel insulating layer and on the gate insulating layer, the sense transistor gate comprising a floating gate on the tunnel insulating layer and on the gate insulating layer, a first interlevel insulating layer on the floating gate opposite the tunnel insulating layer and the gate insulating layer, and a sense gate on the first interlevel insulating layer opposite the floating gate;
  a select transistor gate on the gate insulating layer and spaced apart from the sense transistor gate, the select transistor gate comprising a first select gate on the gate insulating layer that is spaced apart from the sense transistor gate, a second interlevel insulating layer on the first select gate opposite the gate insulating layer, and a second select gate on the second interlevel insulating layer opposite the first select gate that is spaced apart from the sense gate;
  a first doped region in the integrated circuit substrate that extends from beneath the tunnel insulating layer to outside the sense transistor gate and extends to a first depth in the integrated circuit substrate;
  a second doped region in the integrated circuit substrate that extends from the first doped region to beneath the select transistor gate, extends to the first depth and is lightly doped relative to the first doped region;
  a third doped region in the integrated circuit substrate that is outside the sense transistor gate and extends to a second depth in the integrated circuit substrate;
  a fourth doped region in the integrated circuit substrate that extends from the third doped region to beneath the sense transistor gate, extends to a third depth in the integrated circuit substrate, deeper then the second depth, and is lightly doped relative to the third doped region;
  a fifth doped region in the integrated circuit substrate that is outside the sense transistor gate and extends to a fourth depth in the integrated circuit substrate; and
  a sixth doped region that extends from the fifth doped region to beneath the select transistor gate, extending to a fifth depth in the integrated circuit substrate, deeper than the fourth depth, and is lightly doped relative to the fifth doped region.

8. An EEPROM according to claim 7, wherein the first, third and fifth depths are equal and the second and fourth depths are equal.

* * * * *